United States Patent
Schrinsky

(10) Patent No.: US 8,309,424 B2
(45) Date of Patent: Nov. 13, 2012

(54) METHODS OF FORMING ELECTRICALLY INSULATIVE MATERIALS, METHODS OF FORMING LOW K DIELECTRIC REGIONS, AND METHODS OF FORMING SEMICONDUCTOR CONSTRUCTIONS

(75) Inventor: Alex J. Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 13/043,902

(22) Filed: Mar. 9, 2011

(65) Prior Publication Data
US 2011/0159685 A1 Jun. 30, 2011

Related U.S. Application Data

(63) Continuation of application No. 12/270,530, filed on Nov. 13, 2008, now Pat. No. 7,927,964.

(51) Int. Cl.
*H01L 21/76* (2006.01)
(52) U.S. Cl. .................. 438/422; 438/784; 257/E21.27
(58) Field of Classification Search ................ 438/411, 438/422, 950, 952; 257/E21.246, E21.27
See application file for complete search history.

(56) References Cited

U.S. PATENT DOCUMENTS

| 5,310,700 A | 5/1994 | Lien et al. |
|---|---|---|
| 5,461,003 A * | 10/1995 | Havemann et al. ........... 438/666 |
| 5,880,018 A | 3/1999 | Boeck et al. |
| 7,112,526 B2 * | 9/2006 | Okada .......................... 438/622 |
| 2008/0124917 A1 | 5/2008 | Oh et al. |

* cited by examiner

*Primary Examiner* — Chandra Chaudhari
(74) *Attorney, Agent, or Firm* — Wells St. John P.S.

(57) ABSTRACT

Some embodiments include methods of forming low k dielectric regions between electrically conductive lines. A construction may be formed to have a plurality of spaced apart electrically conductive lines, and to have sacrificial material between the electrically conductive lines. The sacrificial material may be removed. Subsequently, electrically insulative material may be deposited over and between the lines. The deposition of the insulative material may occur under conditions in which bread-loafing of the insulative material creates bridges of the insulative material across gas-filled gaps between the lines. The gas-filled gaps may be considered to correspond to low k dielectric regions between the electrically conductive lines. In some embodiments the sacrificial material may be carbon. In some embodiments, the deposited insulative material may be a low k dielectric material, and in other embodiments the deposited insulative material may not be a low k dielectric material.

15 Claims, 9 Drawing Sheets

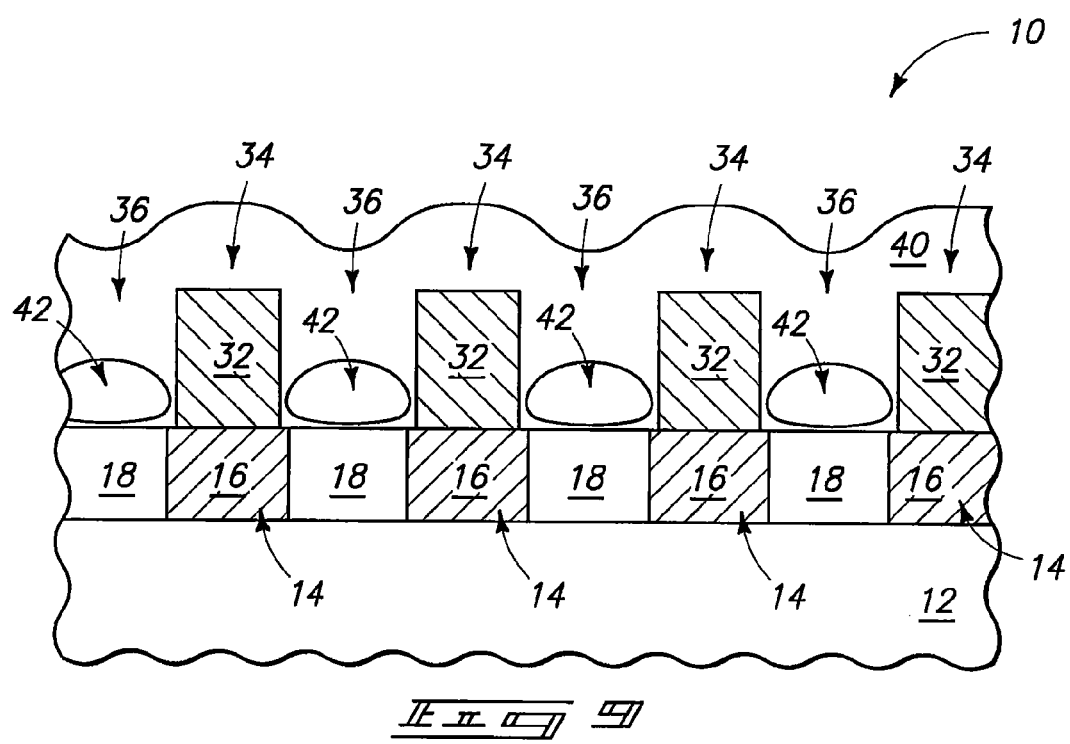
F I G 9
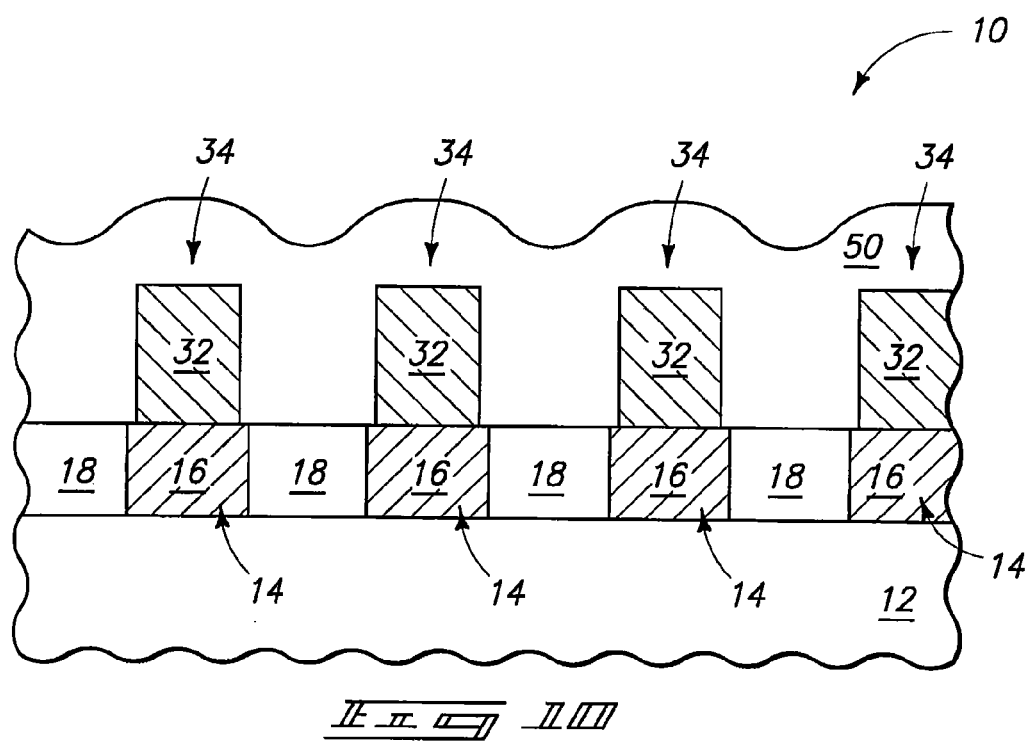
F I G 10

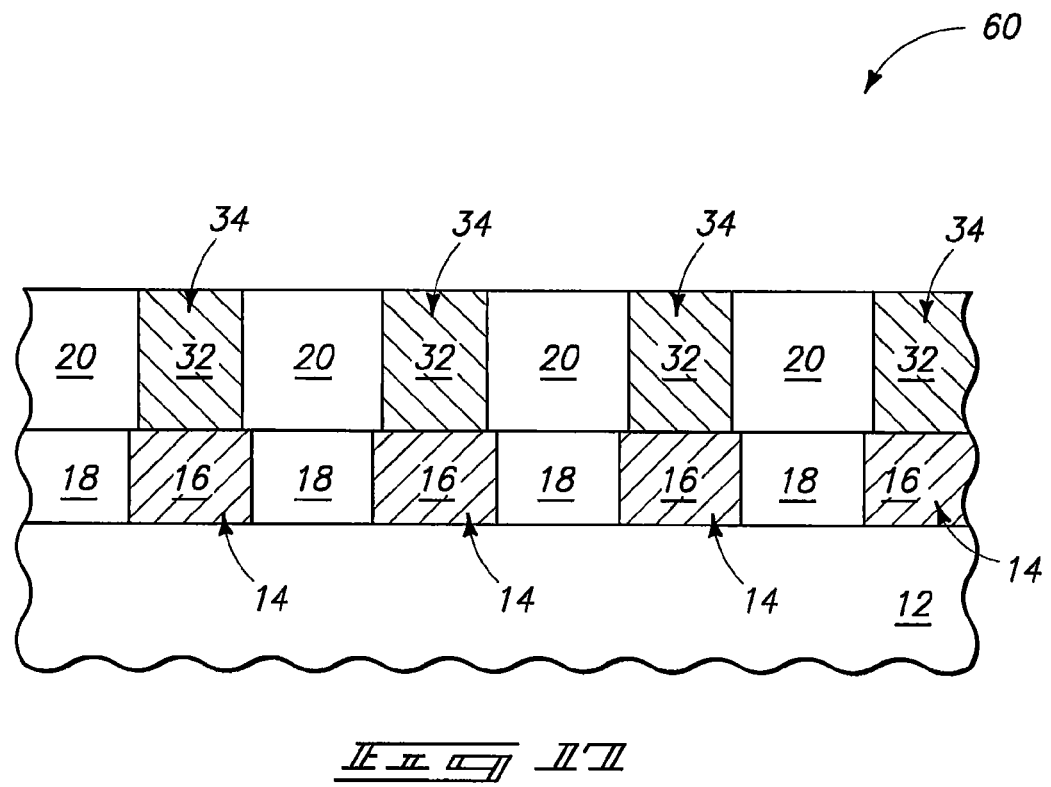
F I G  17

METHODS OF FORMING ELECTRICALLY INSULATIVE MATERIALS, METHODS OF FORMING LOW K DIELECTRIC REGIONS, AND METHODS OF FORMING SEMICONDUCTOR CONSTRUCTIONS

RELATED PATENT DATA

This patent resulted from a continuation of U.S. patent application Ser. No. 12/270,530, which was filed Nov. 13, 2008, and which is hereby incorporated herein by reference.

TECHNICAL FIELD

Methods of forming electrically insulative materials, methods of forming low k dielectric regions, and methods of forming semiconductor constructions.

BACKGROUND

Electrically insulative material may be incorporated into integrated circuitry, and may be utilized to electrically isolate adjacent electrical devices from one another. A problem that may occur when two electrical devices are separated from one another by an insulative material is capacitive coupling between the devices. The capacitive coupling may create cross-talk between the adjacent electrical devices.

Capacitive coupling may be problematic in numerous applications. For instance, bitlines are often arranged as a plurality of parallel lines. The individual bitlines are spaced from one another by insulative material. If adjacent bitlines are too close to one another, there may be cross-talk between them. The distance that corresponds to "too close" may depend on numerous factors, including the dielectric constant of the insulative material. An insulative material with a low dielectric constant can reduce cross-talk between the adjacent bitlines relative to an insulative material having a higher dielectric constant.

A continuing goal of integrated circuit fabrication is to increase integration density, with a corresponding goal being to reduce the distance between adjacent components. Thus, it may be desired to form low k dielectric materials between some of the adjacent components of an integrated circuit, such as, for example, between adjacent bitlines.

BRIEF DESCRIPTION OF THE DRAWINGS

FIGS. 8 and 9 are diagrammatic, cross-sectional views of the portion of FIG. 1 shown at sequential process stages subsequent to FIG. 6.

FIG. 10 is a diagrammatic, cross-sectional view of the portion of FIG. 1 shown at a processing stage alternative to that of FIG. 9.

FIGS. 12-17 are diagrammatic, cross-sectional views of the portion of FIG. 1 shown at a sequential processing stages of an embodiment alternative to that of FIGS. 2-6.

DETAILED DESCRIPTION OF THE ILLUSTRATED EMBODIMENTS

Difficulties are often encountered in attempting to form low k dielectric material utilizing conventional methods. In some embodiments, new methods are presented for forming low k dielectric material between electrically conductive structures. Example embodiments are described with reference to FIGS. 1-17.

Figure 1:
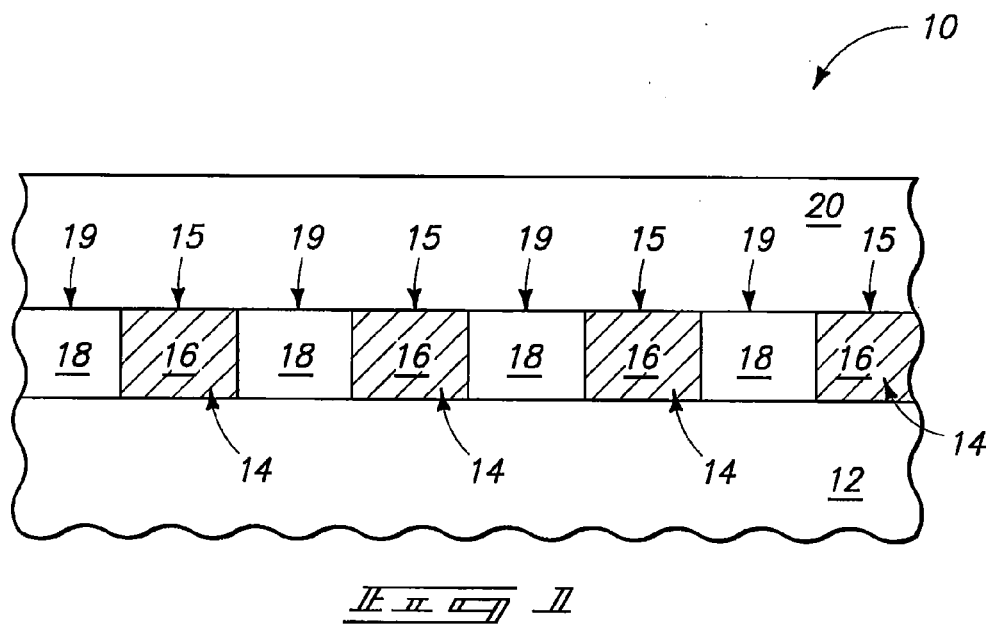
FIGS. 1-6 are diagrammatic, cross-sectional views of a portion of a semiconductor construction at various sequential process stages of an embodiment.

FIG. 1 shows a portion of a semiconductor construction 10. The construction includes a semiconductor substrate 12 having a plurality of electrically conductive structures 14 supported thereover.

Substrate 12 may comprise, consist essentially of, or consist of, for example, monocrystalline silicon lightly-doped with background p-type dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" means any supporting structure, including, but not limited to, the semiconductive substrates described above. Although substrate 12 is shown to be homogeneous, the substrate may comprise various layers and structures associated with integrated circuit fabrication in some embodiments.

Electrically conductive structures 14 are formed of conductive material 16. Conductive material 16 may comprise any suitable composition, or combination of compositions; and may, for example, comprise, consist essentially of, or consist of one or more of metals, metal-containing compositions, and conductively-doped semiconductor material.

The electrically conductive structures may have any of numerous shapes, and in some embodiments may be interconnects extending to source/drain regions (not shown) of transistors (not shown). The transistors may be part of a memory array, such as a dynamic random access memory (DRAM) array or a NAND memory array.

Ultimately, a plurality of electrically conductive features (such as bitlines) are to be formed over conductive structures 14, and low k dielectric material is to be formed between such features (as discussed below). The conductive structures 14 comprise upper surfaces 15, and such surfaces may be referred to as electrical nodes in some of the embodiments described herein.

Electrically conductive structures 14 are spaced from one another by electrically insulative material 18. Such electrically insulative material may comprise any suitable composition or combination of compositions. In some embodiments, insulative material 18 may comprise silicon dioxide, low k dielectric material and/or high k dielectric material. The term "low k dielectric material" refers to dielectric material having a dielectric constant less than that of silicon dioxide (about 3.9), and within this document and the claims that follow means a material having a dielectric constant of less than or equal to about 3. The term "high k dielectric material" refers to dielectric material having a dielectric constant greater than that of silicon dioxide, and within this document and the claims that follow means a material having a dielectric constant of greater than or equal to about 4.

The material 18 has an upper surface 19. In the shown embodiment, the upper surfaces 15 and 19 of the materials 16 and 18 are planarized. Such planarization may be accomplished by, for example, chemical-mechanical polishing (CMP).

A sacrificial material 20 is over materials 16 and 18. Sacrificial material 20 may comprise any suitable composition or combination of compositions. In some embodiments, sacrificial material 20 may comprise, consist essentially of, or consist of carbon, and accordingly may be referred to as a carbon-containing material. If material 20 consists essentially of, or consists of carbon, the carbon may be in either amorphous or transparent form.

In some embodiments, material 20 may be referred to as a first material to distinguish it from other materials that are formed subsequently to material 20.

Figure 2:
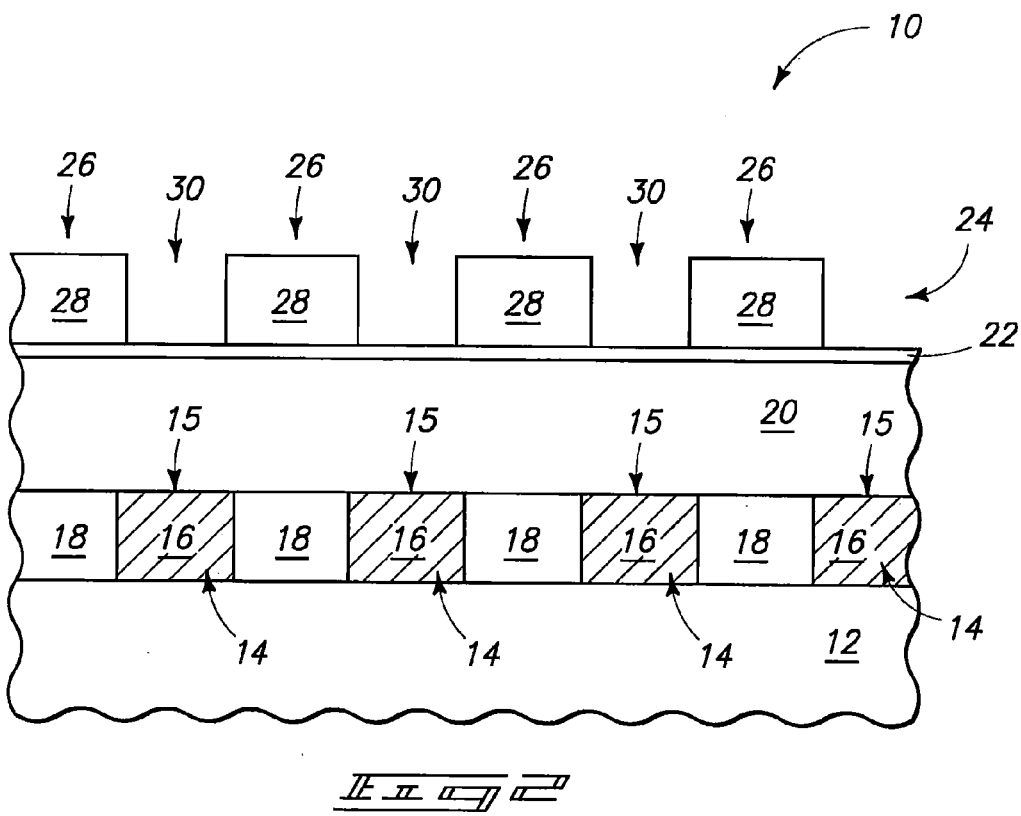

Referring to FIG. 2, an antireflective material 22 is formed over sacrificial material 20. The antireflective material 22 may comprise any suitable composition. In some embodiments, material 22 may correspond to a deposited antireflective coating (DARC); and accordingly may comprise, consist essentially of, or consist of one or both of silicon oxynitride and silicon nitride. The antireflective material 22 may be omitted in some embodiments. In some embodiments, material 22 may function as an etch stop in addition to being an antireflective material (the etch stop function may occur during a planarization discussed below with reference to FIG. 6). In other embodiments, a material which is not antireflective may be used as the etch stop instead of antireflective material 22. If a material is used that is not antireflective, it may be desired to also use at least one antireflective material (for instance, a bottom antireflective coating (BARC)) under, over, or within the sacrificial material 20.

A patterned mask 24 is formed over antireflective material 22. The patterned mask comprises a plurality of features 26. Such features may comprise photolithographically-patterned photoresist 28. A plurality of openings 30 are between the features 26.

Figure 3:
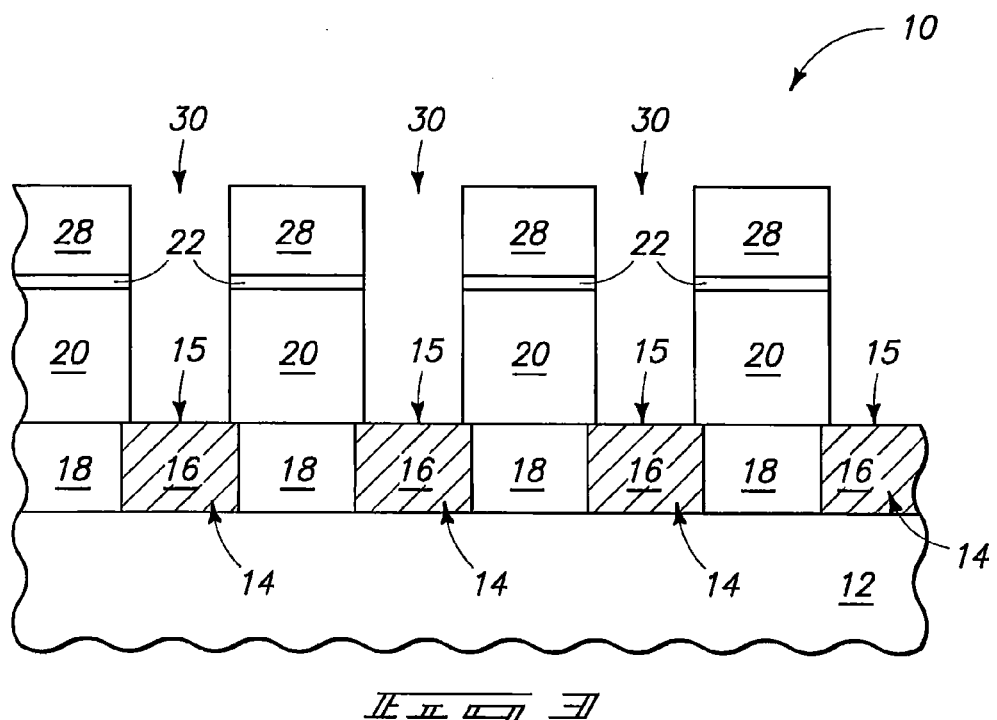

Referring to FIG. 3, openings 30 are extended through materials 20 and 22 with one or more suitable etches. The openings extend to the upper surfaces 15 of conductive structures 14. In some embodiments, the etching through materials 20 and 22 may comprise two different etches. A first etch may utilize hydrocarbon and HBr (for instance, $CF_4$/HBr), and may be used to etch through antireflective material 22; and a second etch may utilize one or more of $O_2$, $SO_2$, COS, CO, HBr and hydrocarbons, and may be used to etch through a carbon-containing material 20 (for instance, the etch may utilize $HBr/O_2/N_2$).

The openings 30 may have any suitable shape, and in some embodiments may correspond to trenches extending into and out of the page relative to the cross-section of FIG. 3.

An advantage of having sacrificial material 20 consist of carbon is that the carbon may be readily removed selectively relative to the underlying conductive material 16 (for instance, carbon may be readily removed selectively relative to various metals and metal-containing compositions). Additionally, the carbon may be removed with very good critical dimension (CD) control, and with a relatively high avoidance of pattern buckling.

Figure 4:
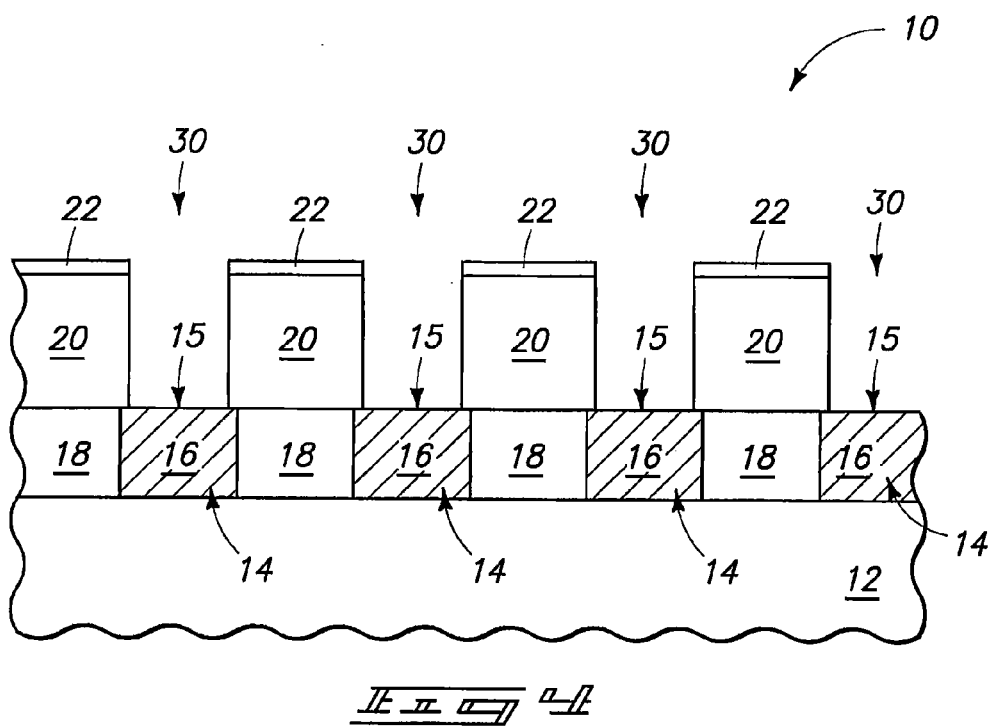

Referring to FIG. 4, masking material 28 (FIG. 3) is removed.

Figure 5:
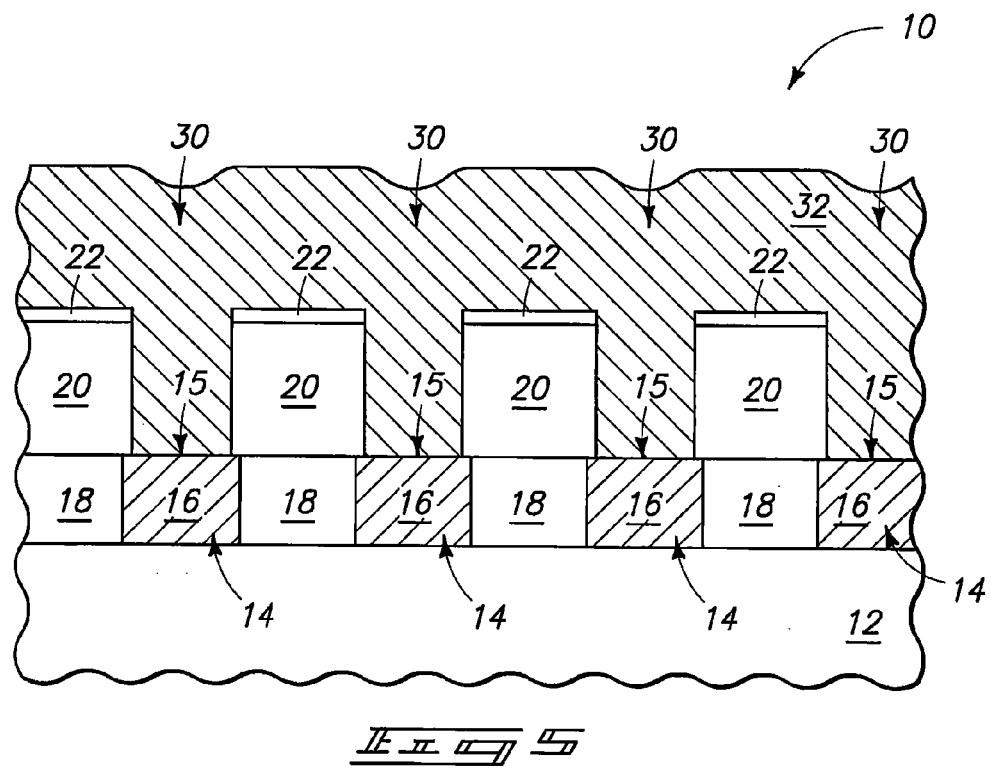

Referring to FIG. 5, electrically conductive material 32 is formed over antireflective material 22, and within the openings 30. Electrically conductive material 32 may comprise any suitable composition, or combination of compositions; and may, for example, comprise, consist essentially of, or consist of one or more of various metals (for instance, tungsten, palladium, copper, etc.), metal-containing compositions (for instance, metal nitride, metal silicide, etc.) and conductively-doped semiconductor materials (for instance, conductively-doped silicon, conductively-doped germanium, etc.).

In some embodiments, conductive material 32 may comprise a first layer of a metal-containing composition (for instance, a metal nitride, such as titanium nitride) which partially fills openings 30, and a second layer of metal (for instance, tungsten) which fills the remaining portions of openings 30.

An advantage of utilizing carbon as sacrificial material 20 in some embodiments may be that the carbon can withstand deposition temperatures utilized for physical vapor deposition (PVD) and/or chemical vapor deposition (CVD) of various metals, such as tungsten. In other embodiments, an advantage of the carbon may be that the carbon can withstand processing conditions utilized for plating of various metals, such as, for example, the processing conditions utilized for plating copper.

Figure 6:
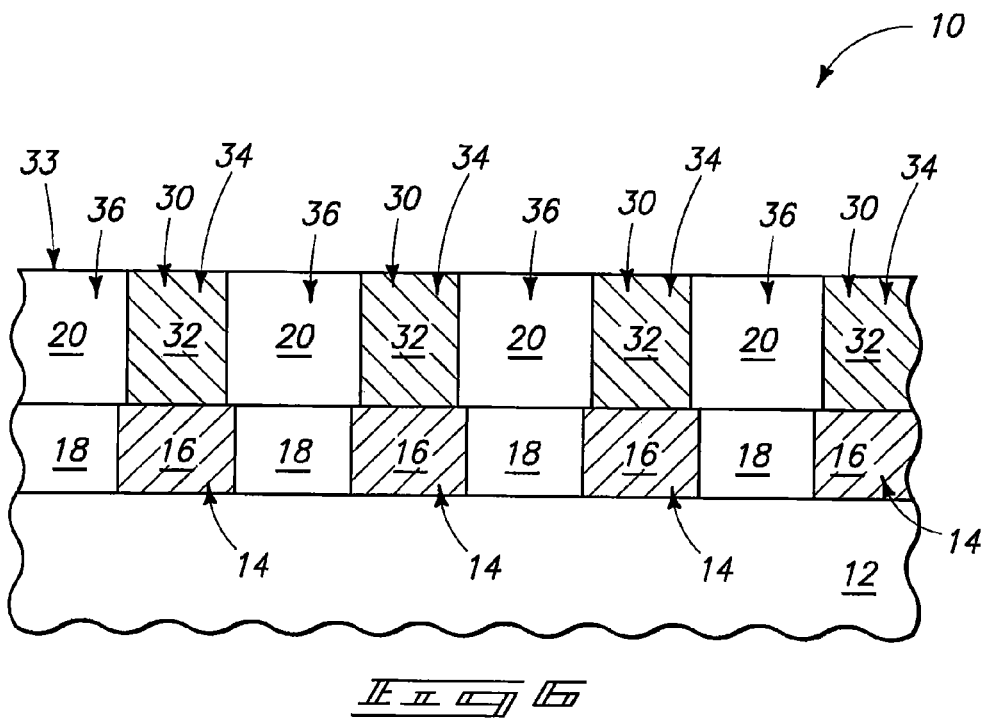

Referring to FIG. 6, electrically conductive material 32 is removed from over sacrificial material 20, while leaving the conductive material 32 within the openings 30. Such removal may be accomplished by planarization (for instance, by CMP), and in the shown embodiment has also moved antireflective material 22 (FIG. 5) to leave a planarized upper surface 33 extending across sacrificial material 20 and conductive material 32. In some embodiments (not shown), material 22 may function as an etch stop during the planarization so that material 22 remains after the planarization, with the remaining planarized surface extending across material 22 and material 32. If material 22 remains after the planarization, it may be subsequently removed with an etch to leave a construction described below with reference to FIG. 11.

Although FIG. 6 shows a construction resulting from utilization of planarization to remove conductive material 32 from over sacrificial material 20, other processing may be utilized to remove the conductive material in other embodiments. For instance, a dry etch back may be used in some embodiments, and/or a wet etch may be utilized.

Figure 7:
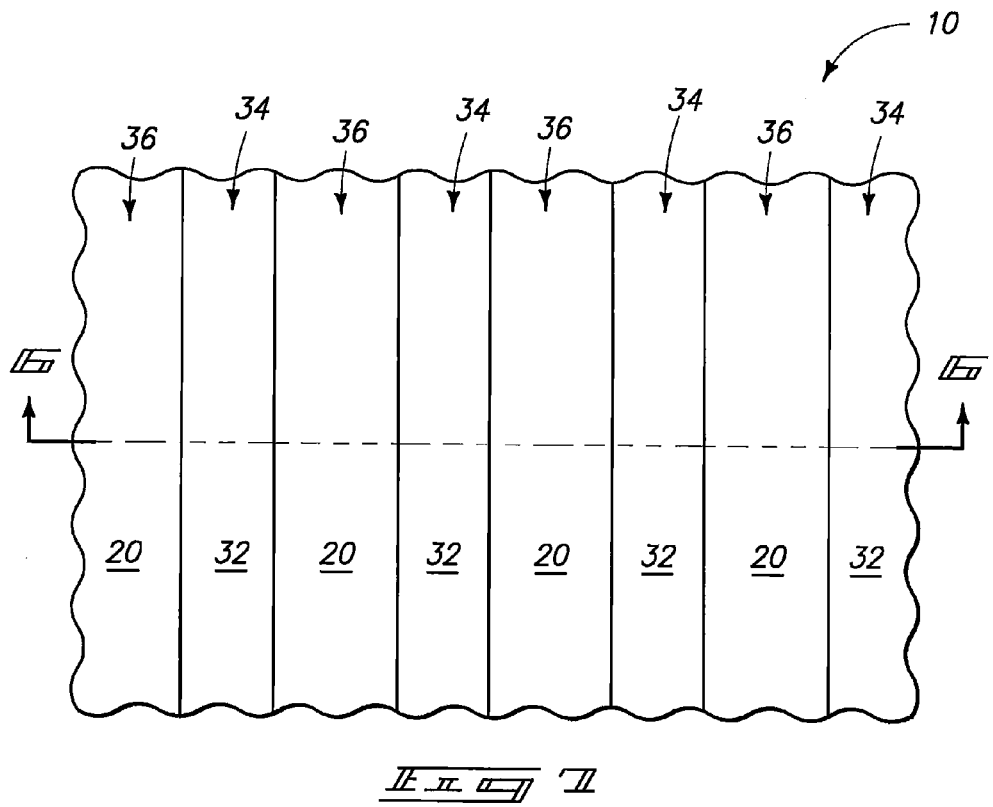
FIG. 7 is a diagrammatic top view of the semiconductor construction at the processing stage of FIG. 6. The cross-section of FIG. 6 is along the line 6-6 of FIG. 7.

The electrically conductive material 32 remaining within openings 30 corresponds to a plurality of electrically conductive structures 34 spaced apart from one another by intervening regions 36. The conductive structures 34 may be referred to as electrically conductive pedestals in some embodiments, and may be referred to as electrically conductive contacts in other embodiments. The term "pedestal" means any structure projecting upwardly from the underlying substrate. In some embodiments, the pedestals may correspond to lines extending into and out of the page relative to the cross-section of FIG. 6. For instance, FIG. 7 shows a top view of an example embodiment in which structures 34 correspond to lines. FIG. 7 also shows that sacrificial material 20 forms a plurality of sacrificial lines within the regions 36, with individual sacrificial lines separating adjacent structures 34 from one another.

Figure 8:
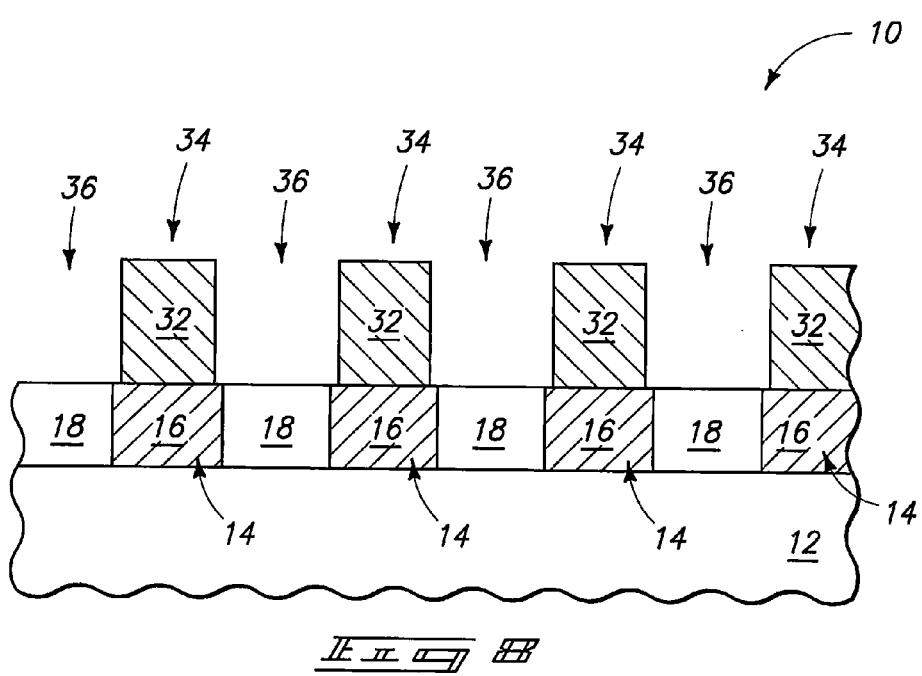

Referring to FIG. 8, sacrificial material 20 (FIG. 7) is removed from the regions 36 between the electrically conductive structures 34. Such removal may be accomplished with any suitable processing. For instance, if material 20 is carbon, the removal may be accomplished with an $O_2$ plasma (the plasma may be of any suitable density) and/or any other suitable strip of carbon.

Referring to FIG. 9, a material 40 is deposited over the electrically conductive structures 34, and within the regions 36 between the structures 34. Material 40 is deposited under conditions such that bread-loafing occurs to leave gaps 42 with the material 40. More specifically, the bread-loafing forms bridges of material 40 across the regions 36, resulting in the formation of gaps 42. The gaps 42 may be filled with gas present during the deposition of material 40, and thus may be referred to as gas-filled gaps. In some embodiments, material 40 may be referred to as a first dielectric material formed within regions 36, and the gas-filled gaps 42 may be referred to as a second dielectric material; with such second dielectric material being formed under material 40 and within the regions 36.

The gaps 42 correspond to low k regions. Specifically, gases, such as air, are low k dielectric materials, and thus the gas within gaps 42 may be considered low k dielectric material.

Bread-loafing is generally considered a problem in prior art processes. Numerous conditions for inducing the bread-loafing problem (which may sometimes be referred to as a key-holing problem) are known in the art, and many of such conditions are identified in the prior art as problems which are too be avoided. In contrast, bread-loafing (or key-holing) is taken advantage of in some of the embodiments described herein, so that instead of being a problem, it is utilized to induce formation of a desired low k dielectric material between the conductive structures 34.

The conditions suitable for formation of gaps 42 may depend in part on the dimensions of conductive structures 34, and the spacing between the conductive structures. In some embodiments, the conductive structures 34 may have aspect ratios of about four, and may have heights of from about 200 nanometers to about 400 nanometers. The spacing between adjacent conductive structures may be less than 100 nanometers, less than 75 nanometers, or even less than 50 nanometers, in some embodiments.

Material 40 may comprise any suitable composition or combination of compositions; and may be, for example, silicon dioxide, high k dielectric material, and/or low k dielectric material. In some embodiments, material 40 may comprise, consist essentially of, or consist of silicon dioxide; and may be formed by deposition utilizing tetraethylorthosilicate (TEOS). In some embodiments, it may be advantageous for all of the material within openings 36 to be low k. In such embodiments, material 40 may consist of one or more low k dielectric materials, such as, for example, one or more compositions selected from the group consisting of fluorine-doped silicon dioxide, carbon-doped silicon dioxide, porous silicon dioxide, and organic polymeric dielectrics.

The removal of material 20 (FIG. 6) from regions 36, and subsequent formation of low k dielectric material within regions 36, may be considered to be replacement of material 20 with the low k dielectric material, in some embodiments.

FIG. 9 shows an embodiment in which the low k dielectric material formed between structures 34 comprises gas-filled gaps 42. In other embodiments, the low k dielectric material may consist of one or more traditional low k compositions, such as, for example, one or more compositions selected from the group consisting of fluorine-doped silicon dioxide, carbon-doped silicon dioxide, porous silicon dioxide, and organic polymeric dielectrics. FIG. 10 shows an embodiment in which low k dielectric material 50 is formed to extend over and between conductive structures 34. In the embodiment of FIG. 10, the low k dielectric material 50 has been deposited under conditions which uniformly fill regions 36 with the low k dielectric material, rather than producing the gaps 42 (FIG. 9).

Figure 11:
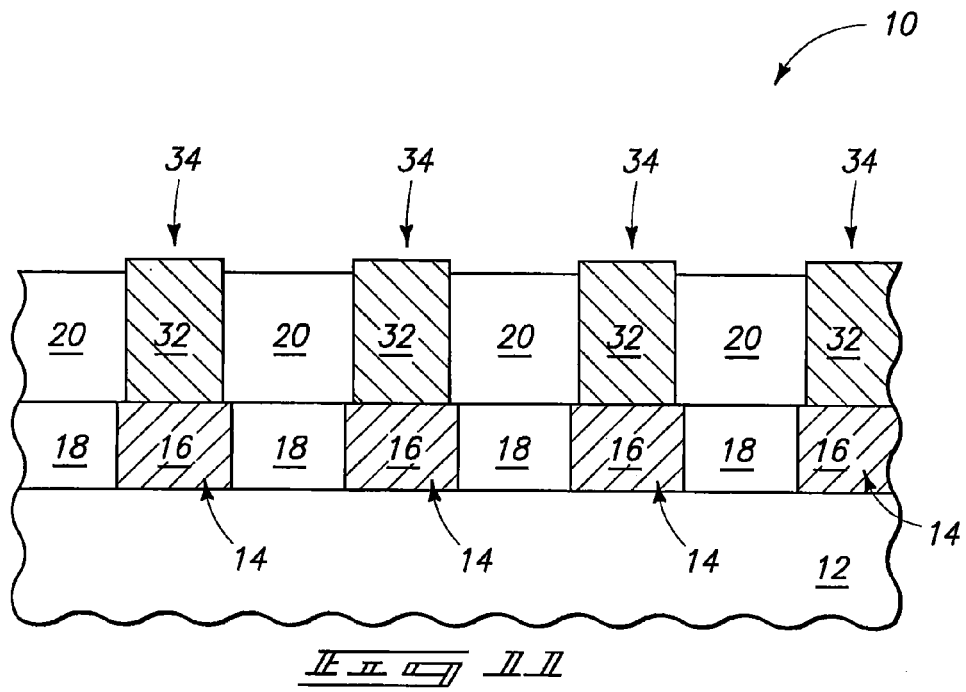
FIG. 11 is a diagrammatic, cross-sectional view of the portion of FIG. 1 shown at a processing stage alternative to that of FIG. 6.

As discussed above with reference to FIG. 6, the planarization shown in FIG. 6 is but one of many ways to remove material 32 from over sacrificial material 20. Another method for removing material 32 would utilize planarization down to a surface of material 22 (FIG. 5), followed by an etch to remove material 22. FIG. 11 shows a construction that may result from such processing.

Another example method, alternative to that of FIGS. 6 and 11, for removing materials 22 and 32 from over material 20 is to utilize an etch which may simultaneously remove the materials 22 and 32 selectively relative to a carbon-containing material 20. For instance, an etch utilizing $NF_3/Cl_2$ or $CF_4/Cl_2$ may remove both silicon oxynitride and metal selectively relative to a carbon-containing material.

In the embodiments of FIGS. 1-11, a photolithographically-patterned mask is directly used to define locations of openings through a sacrificial material. Specifically, FIG. 2 illustrates a processing stage in which photolithographically-patterned photoresist is utilized directly as a patterned mask for patterning an underlying sacrificial material. In other embodiments, the photoresist may be utilized to create a pattern in another material, and such other material may then be utilized as the patterned mask to pattern the underlying sacrificial material. FIGS. 12-17 illustrate an example embodiment in which photolithographically-patterned photoresist is utilized to impart a pattern to spacers, and in which the spacers are then utilized to pattern an underlying sacrificial material. Similar numbering will be used to describe FIGS. 12-17 as is used above in describing FIGS. 1-9, where appropriate.

Figure 12:
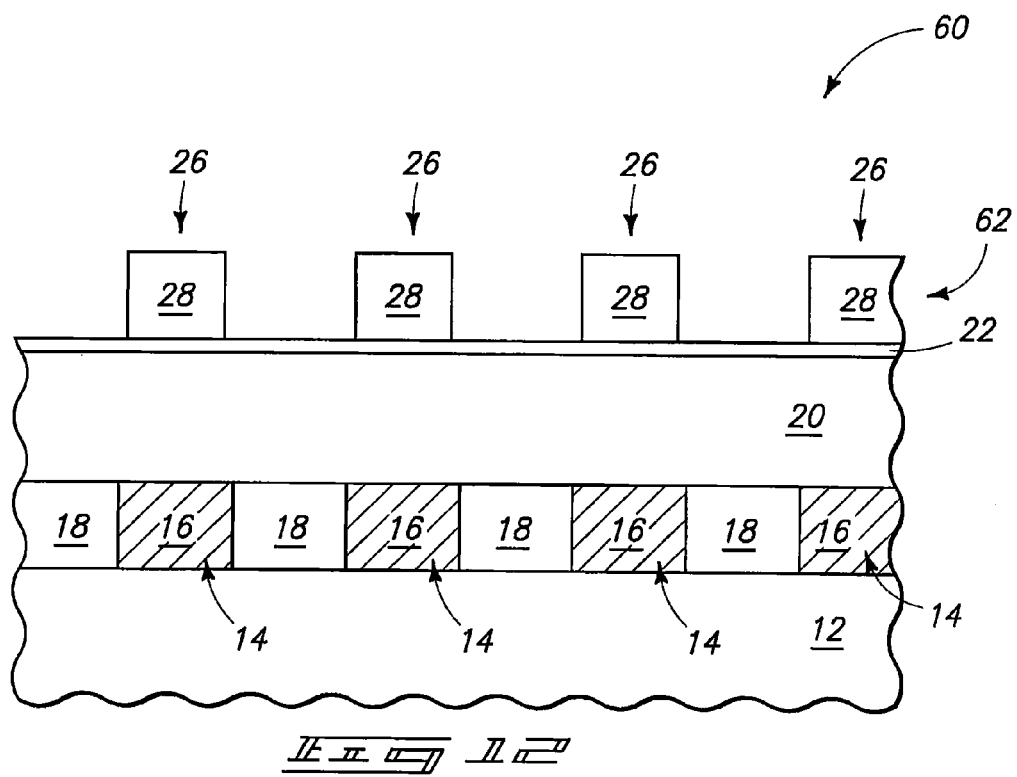

FIG. 12 shows a portion of a semiconductor construction 60 at a processing stage alternative to that of FIG. 2. The construction 60 includes the substrate 12, conductive structures 14 (containing material 16), insulative material 18, sacrificial material 20 and antireflective material 22 discussed above with reference to FIGS. 1 and 2. Construction 60 also comprises a mask 62 of photolithographically-patterned photoresist 28, with the photoresist 28 being in the form of spaced apart features 26. However, in contrast to the construction of FIG. 2, individual features of photoresist 28 are directly over conductive structures 14, rather than being directly over the insulative material 18 between the conductive structures.

Figure 13:
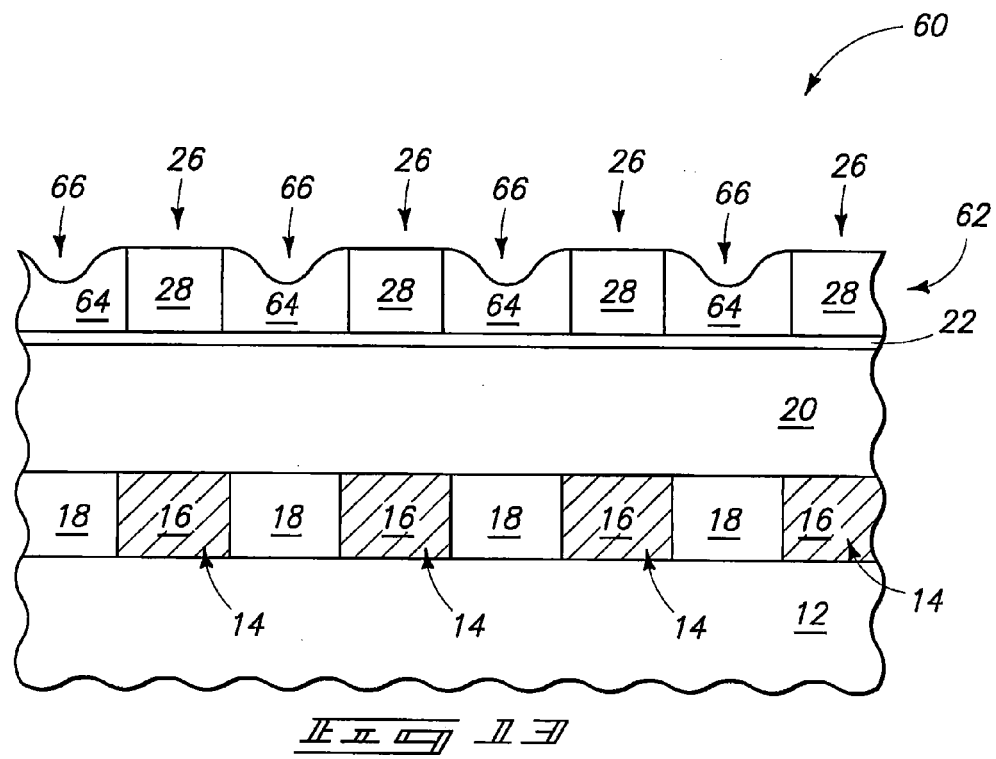

Referring to FIG. 13, spacer material 64 is formed over and between the photoresist features 26, and is then anisotropically etched to form a plurality of spacers 66 within the spaces between the photoresist features 26. The spacer material may comprise any suitable composition or combination of compositions, and may, for example, comprise, consist essentially of, or consist of one or more of silicon dioxide, silicon nitride and silicon oxynitride.

Figure 14:
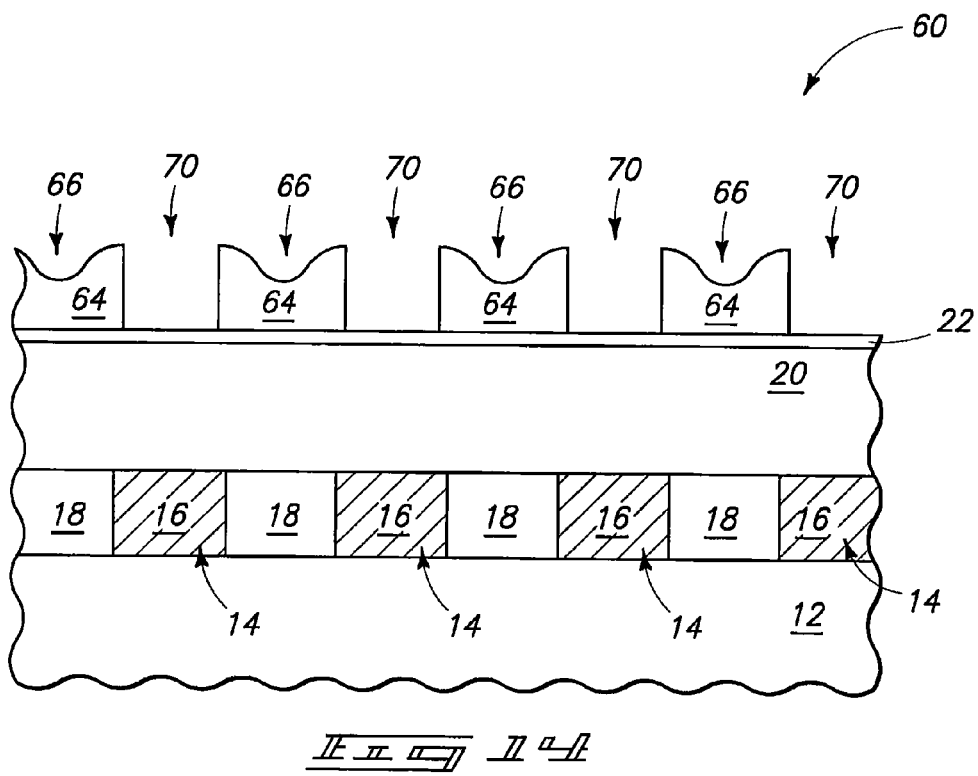

Referring to FIG. 14, photoresist 28 (FIG. 13) is removed, to leave openings 70 between the spacers 66. The spacers 66 thus correspond to a patterned mask formed over the underlying materials.

Figure 15:
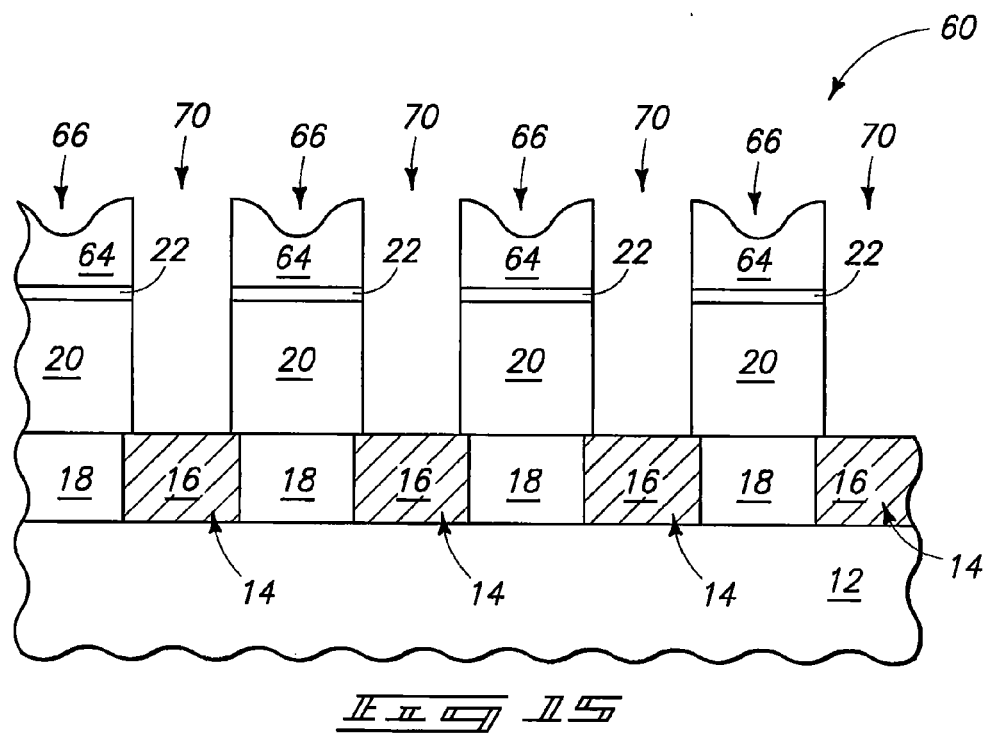

Referring to FIG. 15, openings 70 are extended through underlying materials 20 and 22 with one or more suitable etches, such as, for example, the etches discussed above with reference to FIG. 3.

Figure 16:
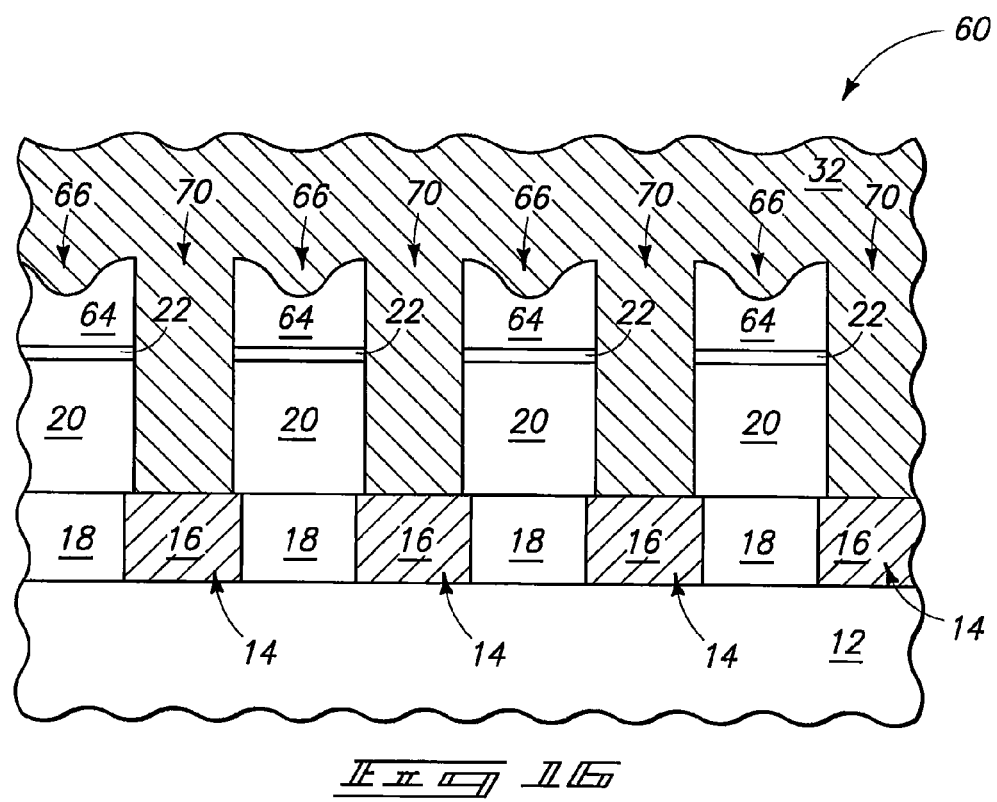

Referring to FIG. 16, conductive material 32 is formed within openings 70 and over spacers 66. In some embodiments, spacers 66 may be removed before formation of conductive material 32. However, in embodiments in which subsequent processing is going to utilize planarization to remove materials from over material 20 (discussed below with reference to FIG. 17), it may reduce process steps to simply leave spacers 66 in place during the deposition of conductive material 32.

Referring to FIG. 17, planarization is conducted to remove conductive material 32 from over sacrificial material 20, and also to remove materials 22 and 64 (FIG. 16) from over the sacrificial material. The planarization leaves construction 60 in an identical configuration to the construction 10 at the processing stage of FIG. 6, and specifically forms a plurality of electrically conductive structures 34 comprising the remaining material 32. Construction 60 may be subsequently subjected to processing analogous to that of various of FIGS. 8-10 to form low k dielectric material between the conductive structures 34.

Although FIG. 17 shows construction 60 after planarization has been utilized to remove the materials 22, 32, and 64 from over sacrificial material 20, in other embodiments one or more etches may be utilized alternatively to planarization, or in combination with planarization, to remove the various materials from over sacrificial material 20.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a semiconductor construction, comprising:
   forming a plurality of conductive structures supported by a silicon-containing substrate;
   forming a first material over the conductive structures;
   forming photoresist over the first material;
   photolithographically patterning the photoresist to form a first pattern of the photoresist, the first pattern comprising a plurality of features;
   forming spacers along the features;
   removing the photoresist to leave a patterned mask consisting of the spacers;
   transferring a pattern from the patterned mask into the first material to form a plurality of openings extending through the first material to the conductive structures;
   forming electrically conductive material over the first material and within the openings; the electrically conductive material within the openings being in direct contact with the conductive structures;
   removing the electrically conductive material from over the first material while leaving the electrically conductive material within the openings as a plurality of spaced apart electrically conductive pedestals; the electrically conductive pedestals being separated from one another by the first material;
   removing the first material from between the electrically conductive pedestals;
   after removing the first material, forming one or more low k dielectric materials between the electrically conductive pedestals.

2. The method of claim 1 wherein the first material comprises carbon.

3. The method of claim 1 wherein the first material consists of carbon.

4. The method of claim 1 wherein the electrically conductive pedestals are electrically conductive lines.

5. The method of claim 1 wherein the forming of the one or more low k dielectric materials comprises deposition of dielectric material over and between the electrically conductive pedestals under conditions in which bread-loafing occurs to leave gas-filled gaps under the dielectric material and between the electrically conductive pedestals.

6. The method of claim 5 wherein the dielectric material is a composition selected from the group consisting of fluorine-doped silicon dioxide, carbon-doped silicon dioxide, porous silicon dioxide, and organic polymeric dielectrics.

7. A method of forming a semiconductor construction, comprising:
   forming a first material over a plurality of conductive structures supported by a silicon-containing substrate;
   forming an antireflective composition over the first material;
   forming photoresist over the antireflective composition;
   photolithographically patterning the photoresist to form a patterned mask from the photoresist;
   transferring a pattern from the patterned mask through the antireflective composition and the first material to form openings extending to the conductive structures;
   forming electrically conductive material over the antireflective composition and in direct contact with the conductive structures at the bottoms of the openings;
   removing the electrically conductive material and the antireflective composition from over the first material, while leaving the electrically conductive material within the openings as a plurality of spaced apart electrically conductive pedestals; the electrically conductive pedestals being separated from one another by the first material;
   removing the first material from between the electrically conductive pedestals; and
   after removing the first material, forming one or more low k dielectric materials between the electrically conductive pedestals.

8. The method of claim 7 wherein the antireflective composition comprises one or both of silicon nitride and silicon oxynitride.

9. The method of claim 8 wherein the first material comprises carbon; and wherein the forming of the openings comprises:
   a first etch utilizing hydrocarbon and HBr to penetrate through the antireflective composition; and
   a second etch utilizing one or more of $O_2$, $SO_2$ and CO to penetrate through the first material.

10. A method of forming a semiconductor construction, comprising:
   forming a first material over a plurality of conductive structures supported by a semiconductor substrate;
   forming an antireflective composition over the first material;
   forming photoresist over the antireflective composition;
   photolithographically patterning the photoresist to form a first patterned mask from the photoresist, the first patterned mask comprising features;
   forming spacers along the features;
   removing the photoresist to leave a second patterned mask consisting of the spacers;
   transferring a pattern from the second patterned mask through the antireflective composition and the first material to form openings extending to the conductive structures;
   forming electrically conductive material over the second patterned mask and in direct contact with the conductive structures at the bottoms of the openings;
   removing the second patterned mask, the electrically conductive material and the antireflective composition from over the first material, while leaving the electrically conductive material within the openings as a plurality of spaced apart electrically conductive pedestals; the electrically conductive pedestals being separated from one another by the first material;
   removing the first material from between the electrically conductive pedestals; and
   after removing the first material, forming one or more low k dielectric materials between the electrically conductive pedestals.

11. The method of claim 10 wherein the first material comprises carbon.

12. The method of claim 10 wherein the first material consists of carbon.

13. The method of claim 10 wherein the electrically conductive pedestals are electrically conductive lines.

14. The method of claim 10 wherein the forming of the one or more low k dielectric materials comprises deposition of dielectric material over and between the electrically conductive pedestals under conditions in which bread-loafing occurs to leave gas-filled gaps under the dielectric material and between the electrically conductive pedestals.

15. The method of claim 10 wherein the antireflective composition comprises one or both of silicon nitride and silicon oxynitride.

* * * * *